United States Patent [19]

Matsumoto et al.

[11] Patent Number: 4,926,261
[45] Date of Patent: May 15, 1990

[54] VIDEO NOISE REDUCTION CIRCUIT

[75] Inventors: Hiroaki Matsumoto, Chiba; Tetsuya Senda, Kanagawa; Tokuya Fukuda, Tokyo, all of Japan

[73] Assignee: Sony Corporation, Tokyo, Japan

[21] Appl. No.: 306,382

[22] Filed: Feb. 6, 1989

[30] Foreign Application Priority Data

Feb. 10, 1988 [JP] Japan .................. 62-029824

[51] Int. Cl.$^5$ .................................................. H04N 5/21
[52] U.S. Cl. ........................................ 358/167; 358/36
[58] Field of Search .............. 358/36, 167, 336, 340, 358/905, 228, 213.19, 174, 176; 445/296, 308; 333/14; 307/565, 555, 551, 546

[56] References Cited

U.S. PATENT DOCUMENTS

| | | | |
|---|---|---|---|
| 3,597,638 | 8/1971 | Jensen | 307/555 |
| 4,361,881 | 11/1982 | Clemens | 358/167 |
| 4,768,094 | 8/1988 | Ichinoi | 358/167 |
| 4,825,289 | 4/1989 | Ohta | 358/36 |
| 4,833,537 | 5/1989 | Takeuchi et al. | 358/36 |

FOREIGN PATENT DOCUMENTS

0221475  5/1987  European Pat. Off. .
0016077  1/1989  Japan .
0016078  1/1989  Japan .

Primary Examiner—Tommy P. Chin
Assistant Examiner—James Juo
Attorney, Agent, or Firm—Lewis H. Eslinger; Jay H. Maioli

[57] ABSTRACT

A noise reduction circuit comprises a high pass filter for extracting a signal component containing noise from an input signal, a variable level limiter for limiting the level of the signal component extracted by the filter to produce a noise suppressing signal, and a level adjustor for adjusting the level of the noise suppressing signal. A level detector detects the level of the input signal, and a control signal generator generates first and second control signals based on the detected output of the level detector, supplies the first control signal to the level limiter so as to control the limit level thereof, and supplies the second control signal to the level adjustor so as to control the gain thereof. In a signal subtracter, the noise suppressing signal from the level adjustor is added with reversed polarity to the input signal to suppress the noise contained in the input signal and thereby produce a low-noise output signal.

10 Claims, 3 Drawing Sheets

4,926,261

VIDEO NOISE REDUCTION CIRCUIT

BACKGROUND OF THE INVENTION

1. Field of the Invention

The present invention relates generally to noise reduction circuits and, more particularly, to improvements in a circuit for suppressing noise contained in a signal having a relatively broad frequency band, such as the luminance signal portion of a composite video signal.

2. Description of the Prior Art

In a video signal processing circuit employed in a video camera, videotape recorder, television receiver or the like handling a video signal, the luminance signal portion of the composite video signal is subjected to noise reduction for suppressing noise contained in the luminance signal so that a picture reproduced in accordance with the video signal is improved in quality. In a previously proposed circuit for the reduction of noise in the luminance signal, a noise suppressing signal is produced on the basis of a high frequency component of the luminance signal which contains noise. The noise suppressing signal is added with reversed polarity to the luminance signal so as to cancel noise contained in the luminance signal. Such a previously proposed noise reduction circuit is shown in FIG. 1.

In the noise reduction circuit shown in FIG. 1, a luminance signal $S_Y$ received at an input terminal 11 is supplied to both a delay device 12 and a high pass filter (HPF) 13, and a high frequency component $S_H$ of the luminance signal $S_Y$ which contains noise is obtained from the high pass filter 13. The high frequency component $S_H$ from the high pass filter 13 is supplied to a level limiter 14. The level limiter 14 is composed, as FIG. 2 shows, of an input terminal 15 to which the high frequency component $S_H$ is applied, a capacitor 16 and a resistor 17 connected in series with the input terminal 15, an output terminal 18 connected to the input terminal 15 through the series-connected capacitor 16 and resistor 17, and a pair of diodes 19 and 20 connected in parallel with each other and with opposite polarities between the output terminal 18 and a reference potential terminal which may, for example, be grounded.

The circuit 14 thus constituted has an input-output characteristic as shown in FIG. 3. According to the input-output characteristic shown in FIG. 3, when an input level is within a range such that a signal voltage level applied to both of the diodes 19 and 20 is equal to or lower than a forward voltage drop $+v_d$ at the diode 19 and equal to or higher than a forward voltage drop $-v_d$ at the diode 20, an output level proportional to the input level is obtained. On the other hand, when the input level is such that the signal voltage level applied to both of the diodes 19 and 20 is either higher than the forward voltage drop $+v_d$ at the diode 19 or lower than the forward voltage drop $-v_d$ at the diode 20, an output level having a constant positive or negative value is obtained.

Accordingly, at the output terminal 18 of the level limiter 14 to which the high frequency component $S_H$ is supplied from the input terminal 15, a signal having a relatively small level and containing mainly noise is derived from the high frequency component $S_H$. This derived signal is identified in FIGS. 1 and 2 as $S_N$. The noise suppressing signal $S_N$ is adjusted in level by a level adjustor 21 having a predetermined gain and is supplied to a the negative input terminal of a subtracter 22.

The luminance signal $S_Y$ from the input terminal 11 is delayed by the delay device 12 so as to coincide in time with the noise suppressing signal $S_N$ from the level adjustor 21 and then supplied to the positive input terminal of the subtracter 22. In the subtracter 22, the noise suppressing signal $S_N$ from the level adjustor 21 is added with reversed polarity to (i.e., subtracted from) the luminance signal $S_Y$ delayed by the delay device 12 so that the noise contained in the luminance signal $S_Y$ is cancelled by the level-adjusted noise suppressing signal $S_N$. As a result, a luminance signal $S_Y'$ in which noise is suppressed is obtained from the subtracter 22 to be supplied to the output terminal 23.

In the noise suppression of the luminance signal $S_Y$ carried out in the noise reduction circuit shown in FIG. 1 as described above, both of the limit levels set by the level limiter 14 and the gain of the level adjustor 21 are usually kept constant.

Accordingly, when the level of the luminance signal $S_Y$ is relatively large, the noise contained in the luminance signal $S_Y$ has a relatively low level, and therefore the high frequency component $S_H$ derived from the high pass filter 13 contains noise of relatively low amplitude. On the other hand, when the level of the luminance signal $S_Y$ is relatively small, the noise contained in the luminance signal $S_Y$ has a relatively high level, and therefore the high frequency component $S_H$ derived from the high pass filter 13 contains noise of relatively high amplitude.

With the limit levels set to a constant value by the level limiter 14, certain problems arise. In particular, noise having a relatively low level and a large amount of luminance signal component pass through the level limiter 14 to produce the noise suppressing signal $S_N$ when the noise contained in the luminance singal $S_Y$ has a relatively low level, and noise in the high frequency component $S_H$ does not pass sufficiently through the level limiter 14 to produce the noise suppressing signal $S_N$ when the noise contained in the luminance signal $S_Y$ has a relatively large level. Moreover, in the case where the noise suppressing signal $S_N$ includes noise having a relatively low level and a large amount of luminance signal component, the luminance signal $S_Y'$ obtained from the subtracter 22 is noticeably lacking in a high frequency component thereof, and in the case where the noise suppressing signal $S_N$ does not include a sufficient amount of noise having the relatively large level and having passed through the level limiter 14, the luminance signal $S_Y'$ obtained from the subtracter 22 includes noise that is not suppressed sufficiently.

Further, in a situation where the gain of the level adjustor 21 is set to be constant, the noise contained in the luminance signal $S_Y$ may be suppressed improperly by the noise suppressing signal $S_N$ in the subtracter 22 because of variations in the level of the noise occurring together with variations in the level of the luminance signal $S_Y$. The luminance signal $S_Y'$ obtained at the output terminal 23 may therefore include noise that is insufficiently suppressed.

OBJECTS AND SUMMARY OF THE INVENTION

Accordingly, it is an object of the present invention to provide a noise reduction circuit in which a signal component containing noise is derived from an input signal and applied to a level limiter so as to produce a noise suppressing signal and the noise suppressing signal thus produced is added with reversed polarity to the input signal to suppress the noise in the input signal and which avoids the aforementioned problems and disadvantages encountered with the prior art.

Another objection of the present invention is to provide a noise reduction circuit in which a signal component containing noise is derived from an input signal to be applied to a level limiter so as to produce a noise suppressing signal and the noise suppressing signal thus produced is added with reversed polarity to the input signal to suppress the noise in the input signal and by which (1) the input signal is subjected to noise suppression without noticeably losing a part thereof when the level of the noise contained in the input signal is relatively small; and (2) the noise contained in the input signal is suppressed sufficiently to produce a low-noise output signal when the level of the noise contained in the input signal is relatively large.

A further object of the present invention is to provide a noise reduction circuit in which a signal component containing noise is derived from an input signal to be applied to a level limiter so as to produce a noise suppressing signal and the noise suppressing signal thus produced is added with reversed polarity to the input signal to suppress the noise in the input signal, the noise reduction circuit being specially adapted to reduce noise contained in a luminance signal forming part of a video signal.

In accordance with the present invention, there is provided a noise reduction circuit for reducing noise contained in an input signal, the circuit comprising: input means for receiving an input signal that includes a signal component containing noise; filter means connected to the input means for receiving the input signal and extracting the signal component containing noise from the input signal; variable level limiting means connected to the filter means for limiting a level of the signal component extracted by the filter means to produce a noise suppressing signal; level adjusting means connected to the level limiting means for adjusting a level of the noise suppressing signal; level detecting means connected to the input means for receiving the input signal and producing a detection signal indicating a level of the input signal; control signal generating means connected to said level detecting means for generating first and second control signals in response to said detection signal, supplying said first control signal to said level limiting means so as to control a limit level of said level limiting means, and supplying said second control signal to said level adjusting means so as to control a gain of said level adjusting means; signal subtracting means connected to the input means and the level adjusting means and responsive to the input signal and the noise suppressing signal from said level adjusting means so that the noise suppressing signal is added with reversed polarity to the input signal so as to suppress the noise contained in the input signal; and output means connected to said signal subtracting means for supplying an output signal derived from the signal subtracting means.

In the noise reduction circuit thus constituted, the noise suppressing signal is produced by the level limiter to which the signal component containing noise extracted by the filter from the input signal is supplied. The noise suppressing signal, after being adjusted in level by the level adjustor, is added with reversed polarity to the input signal in the signal subtracter, so that the noise contained in the input signal is suppressed. The first and second control signals are produced by the control signal generator on the basis of the detection signal produced by the level detector representing the level of the input signal. These control signals are used respectively for controlling the limit level of the level limiter in accordance with the level of the input signal and for controlling the gain of the level adjustor in accordance with the level of the input signal.

As indicated above, the limit level of the level limiter is varied in response to the level of the input signal, and the gain of the level adjustor is varied also in response to the level of the input signal. Therefore, the noise suppressing signal supplied to the signal subtracter includes mainly the noise separated from the input signal and has a level corresponding to the level of the noise contained in the input signal in both a situation wherein the level of the noise contained in the input signal is relatively small and a situation wherein the level of the noise contained in the input signal is relatively large. Moreover, the input signal is subjected to noise suppression with no noticeable loss of a part of the output signal when the level of the noise contained in the input signal is relatively small, and the noise contained in the input signal is suppressed sufficiently in the output signal when the level of the noise contained in the input signal is relatively large.

The foregoing and other objects, features and advantages of the present invention will become apparent from the following detailed description which is to be read in conjunction with the accompanying drawings.

DESCRIPTION OF THE PREFERRED EMBODIMENTS

Figure 1:
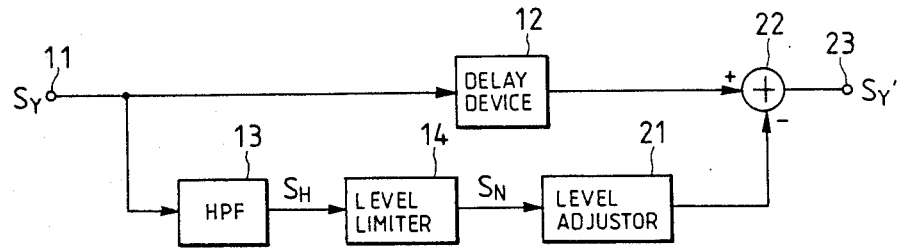
FIG. 1 is a schematic block diagram showing a previously proposed noise reduction circuit.
Figure 2:
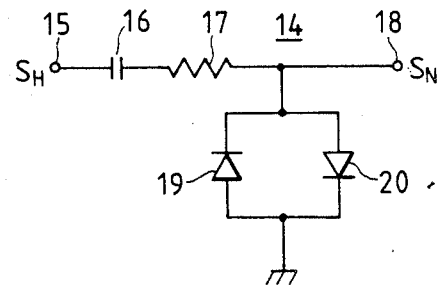
FIG. 2 is a circuit diagram showing a level limiter employed in the noise reduction circuit shown in FIG. 1.
Figure 3:
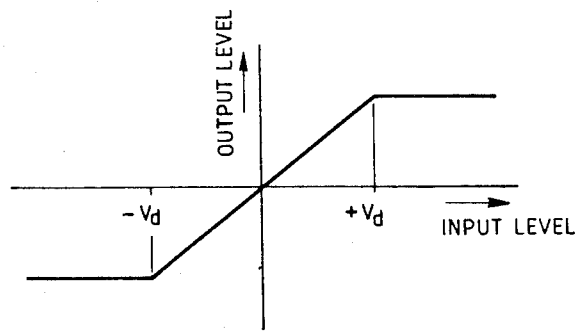
FIG. 3 is a graph showing an input-output characteristic of the level limiter shown in FIG. 2.
Figure 4:
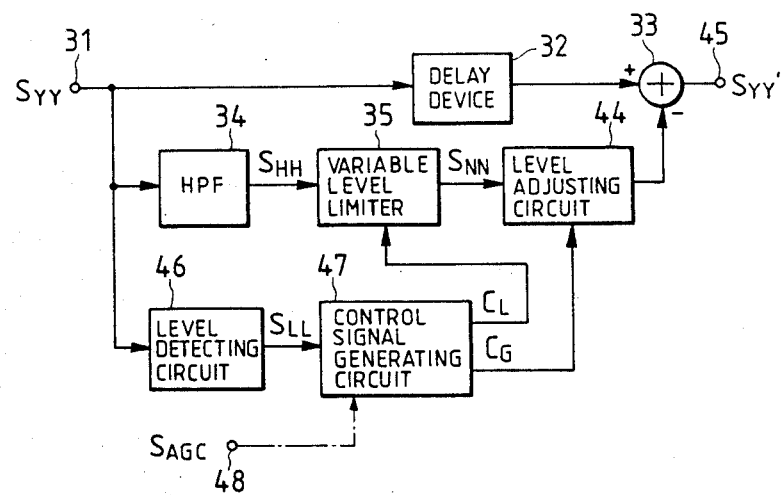
FIG. 4 is a schematic block diagram showing one embodiment of a noise reduction circuit constructed in accordance with the present invention.

FIG. 4 shows an embodiment of a noise reduction circuit constructed in accordance with the present invention which is specially adapted to reduce noise contained in a luminance signal forming a part of a composite video signal.

FIG. 4 illustrates the application of a luminance signal $S_{YY}$ to an input terminal 31. The signal $S_{YY}$ is supplied through a delay device 32 to a subtracter 33 and also to a high pass filter 34, and a high frequency component $S_{HH}$ of the luminance signal $S_{YY}$ which contains noise is extracted from the high pass filter 34. The high frequency component $S_{HH}$ from the high pass filter 34 is supplied to a variable level limiter 35.

Figure 5:
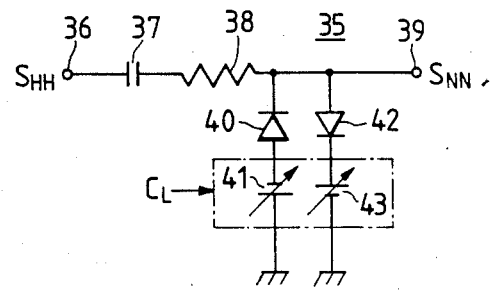
FIG. 5 is a circuit diagram showing a variable level limiter employed in the embodiment shown in FIG. 4.

As FIG. 5 shows, the variable level limiter 35 comprises, for example, an input terminal 36 to which the high frequency component $S_{HH}$ is applied, a capacitor 37 and a resistor 38 connected in series with the input terminal 36, an output terminal 39 connected to the input terminal 36 through the series-connected capacitor 37 and resistor 38, a first serial connection of a diode 40 and a variable voltage source 41, and a second serial connection of a diode 42 and a variable voltage source 43. The first and second serial connections 40, 41 and 42, 43 are connected in parallel with each other between the output terminal 39 and a reference potential terminal which may, for example, be grounded. The diode 40 has its cathode coupled with the output terminal 39 and its anode coupled with the variable voltage source 41, which supplies the anode of the diode 40 with a variable negative bias voltage, and the diode 42 has its anode coupled with the output terminal 39 and its cathode coupled with the variable voltage source 43, which supplies the cathode of the diode 42 with a variable positive bias voltage.

Figure 6:
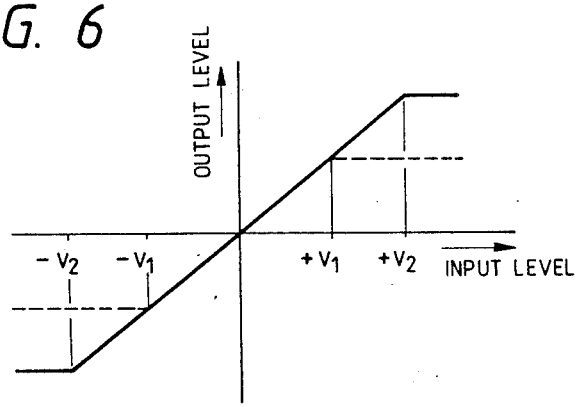
FIG. 6 is a graph showing an input-output characteristic of the variable level limiter shown in FIG. 5.

The variable level limiter 35 has an input-output characteristic as shown in FIG. 6 under a condition in which each of the negative and positive bias voltages supplied respectively by the variable voltage sources 41 and 43 is of the same absolute value. According to the input-output characteristic shown in FIG. 6, with a negative bias voltage of a relatively small absolute value supplied to the diode 40 from the variable voltage source 41 and a positive bias voltage of a relatively small absolute value supplied to the diode 42 from the variable voltage source 43, an output level proportional to the input level is obtained so long as the input level is equal to or lower than $+v_1$ and equal to s higher than $+v_1$ or lower than $-v_1$. When a negative bias voltage of a relatively large absolute value is supplied to the diode 40 from the variable voltage source 41 and a positive bias voltage of a relatively large absolute value is supplied to the diode 42 from the variable voltage source 43, an output level proportional to the input level is obtained so long as the input level is equal to or lower than $+v_2$ (which is higher than $+v_1$) and equal to or higher than $-v_2$ (which is lower than $-v_1$), and an output level having a constant positive or negative value is obtained when the input level is higher than $+v_2$ or lower than $-v_2$.

In the circuit of FIG. 5, each of limit levels applied to the variable level limiter 35 is varied in response to variations in the negative or positive bias voltages supplied from the variable voltage source 41 or 43 in such a manner as to have an absolute value that increases or decreases in proportion to the absolute value of the negative or positive bias voltage. Therefore, the level width of the variable level limiter 35 through which a signal passes without being limited in level is broadened or narrowed in proportion to the absolute value of each of the negative and positive bias voltages supplied respectively from the variable voltage sources 41 and 43.

In the variable level limiter 35, the high frequency component $S_{HH}$ of the luminance signal $S_{YY}$ is caused to pass through the level width of the variable level limiter 35 which is defined by the limit levels set in response to the negative and positive bias voltages supplied from the voltage variable sources 41 and 43. A signal which includes mainly noise having a relatively small level in the high frequency component $S_{HH}$ is derived from the high frequency component $S_{HH}$ at the output terminal 39 as a noise suppressing signal $S_{NN}$. This noise suppressing signal $S_{NN}$ is adjusted in level by a level adjusting circuit 44 as indicated in FIG. 4 and then supplied to the subtracter 33.

In the subtracter 33, the level-adjusted noise suppressing signal $S_{NN}$ is added with reversed polarity to (i.e., subtracted from) the luminance signal $S_{YY}$ from the input terminal 31. The signal $S_{YY}$ is delayed by the delay device 32 so that, as supplied to the subtracter 33, it coincides in time with the noise suppressing signal $S_{NN}$. The noise contained in the luminance signal $S_{YY}$ is therefore canceled by the noise suppressing signal $S_{NN}$. As a result, a luminance signal $S_{YY}'$ in which noise is suppressed is obtained from the subtracter 33 to be supplied to the output terminal 45.

The luminance signal $S_{YY}$ is supplied also to a level detecting circuit 46. The level detecting circuit 46 comprises a portion forming a low pass filter to which the luminance signal $S_{YY}$ is applied and a portion generating a signal having a level corresponding to an output level of the portion forming the low pass filter for detecting an average level of the luminance signal $S_{YY}$ and producing a detection output signal $S_{LL}$ representing the average level of the luminance signal $S_{YY}$. The signal $S_{LL}$ is supplied to a control signal generating circuit 47.

The control signal generating circuit 47 is operative to produce a limit level control signal $C_L$ and a gain control signal $C_G$ on the basis of the detection output signal $S_{LL}$ obtained from the level detecting circuit 46. The control signal generating circuit 47 supplies the variable level limiter 35 and the level adjusting circuit 44 with the limit level control signal $C_L$ and the gain control signal $C_G$, respectively, so as to vary each of the limit levels applied to the variable level limiter 35 and the gain of the level adjusting circuit 44 in response to the detection output signal $S_{LL}$.

In order for the control signal generating circuit 47 to control the limit levels applied to the variable level limiter 35, the limit level control signal $C_L$ from the control signal generating circuit 47 is applied to control terminals of the variable voltage sources 41 and 43 (FIG. 5) to cause the negative and positive bias voltages supplied from the variable voltage sources 41 and 43 to vary in response to the detection output signal $S_{LL}$. The control of the limit levels is performed in such a manner that each of the limit levels which is applied to the variable level limiter 35 when the average level of the luminance signal $S_{YY}$ represented by the detecting output signal $S_{LL}$ is relatively large (and therefore the level of the noise contained in the luminance signal $S_{YY}$ is relatively small) is smaller in absolute value than that applied to the variable level limiter 35 when the average level of the luminance signal $S_{YY}$ is relatively small (and therefore the level of the noise contained in the luminance signal $S_{YY}$ is relatively large).

As indicated above, the limit levels applied to the variable level limiter 35 are varied in response to variations in the average level of the luminance signal $S_{YY}$ represented by the detection output signal $S_{LL}$. When the level of the noise contained in the high frequency component $S_{HH}$ obtained from the high pass filter 34 is relatively small, the noise suppressing signal $S_{NN}$ obtained from the variable level limiter 35 is constituted by the high frequency component $S_{HH}$ having passed through the relatively narrow level width of the variable level limiter 35 which is defined by limit levels set to have relatively small absolute values. The noise suppressing signal $S_{NN}$ in this case therefore includes mainly the noise contained within relatively small levels in the high frequency component $S_{HH}$ and a small amount of high frequency component of the luminance signal $S_{YY}$. On the other hand, when the level of the noise contained in the high frequency component $S_{HH}$ obtained from the high pass filter 34 is relatively large, the noise suppressing signal $S_{NN}$ obtained from the variable level limiter 35 is constituted by the high frequency component $S_{HH}$ having passed through the relatively broad level width of the variable level limiter 35 which is defined by limit levels set to have relatively large absolute values. The noise suppressing signal $S_{NN}$ in this case therefore includes the noise contained within relatively large levels in the high frequency component $S_{HH}$.

The control of the gain of the level adjusting circuit 44 is carried out by the gain control signal $C_G$ supplied to control terminals of the level adjusting circuit 44 by the control signal generating circuit 47. The control is carried out in such a manner that the gain of the level adjusting circuit 44 that is set when the average level of the luminance signal $S_{YY}$ represented by the detection output signal $S_{LL}$ is relatively large (and therefore the level of the noise contained in the luminance signal $S_{YY}$ is relatively small) is smaller than the gain of the variable level limiter 35 when the average level of the luminance signal $S_{YY}$ is relatively small (and therefore the level of the noise contained in the luminance signal $S_{YY}$ is relatively large).

The gain of the level adjusting circuit 44 is varied in response to variations in the average level of the luminance signal $S_{YY}$ represented by the detection output signal $S_{LL}$ as mentioned above. The noise suppressing signal $S_{NN}$ obtained from the variable level limiter 35 is therefore adjusted in level by the level adjusting circuit 44 with a relatively small gain when the level of the noise contained in the high frequency component $S_{HH}$ obtained from the high pass filter 34 is relatively small and with a relatively large gain when the level of the noise contained in the high frequency component $S_{HH}$ obtained from the high pass filter 34 is relatively large.

Control of the limit level applied to the variable level limiter 35 and control of the gain of the level adjusting circuit block 44 are carried out respectively in accordance with the limit level control signal $C_L$ and the gain control signal $C_G$ from the control signal generating circuit block 47 in the manner described above. The noise suppressing signal $S_{NN}$ supplied to the subtracter 33 therefore includes mainly the noise contained in the high frequency component $S_{HH}$ and a small amount of high frequency component of the luminance signal $S_{YY}$ and is adjusted to have a relatively small level when the level of the noise contained in the luminance signal $S_{YY}$ is relatively small. On the other hand, the signal $S_{NN}$ includes in substantial measure the noise contained in the high frequency component $S_{HH}$ and is adjusted to have a relatively large level when the level of the noise contained in the luminance signal $S_{YY}$ is relatively large.

Consequently, the luminance signal $S_{YY}'$ in which the noise is suppressed is generated by the subtracter 33 and supplied to the output 45 without noticeably losing any of the high frequency component thereof when the level of the noise contained in the luminance signal $S_{YY}$ which is supplied to the input terminal 31 is relatively small. Moreover, when the level of the noise contained in the luminance signal $S_{YY}$ which is supplied to the input terminal 31 is relatively large, the noise is well suppressed in the luminance signal $S_{YY}'$ generated by the subtracter 33 and supplied to the output terminal 45.

In the case where the embodiment shown in FIG. 4 is applied to a video signal processing circuit arrangement of a video camera, an AGC error signal $S_{AGC}$ which is used for an automatic gain control (AGC) for a luminance signal in the video signal processing circuit may be supplied through a control terminal 48 to the control signal generating circuit 47 in addition to the detection output signal $S_{LL}$ obtained from the level detecting circuit 46. This is shown with a dot-dash line in FIG. 4. In such a case, the limit level control signal $C_L$ and the gain control signal $C_G$ are produced in response to both the detection output signal $S_{LL}$ obtained from the level detecting circuit 46 and the AGC error signal $S_{AGC}$. The signals $C_L$ and $C_G$ therefore respond more faithfully to variations in the level of the luminance signal $S_{YY}$. The signals $C_L$ and $C_G$ are supplied to the variable level limiter 35 and the level adjusting circuit 44, respectively, from the control signal generating circuit 47, as indicated above. As a result of this the control of the limit levels applied to the variable level limiter 35 and of the gain of the level adjusting circuit 44 is significantly improved.

Figure 7:
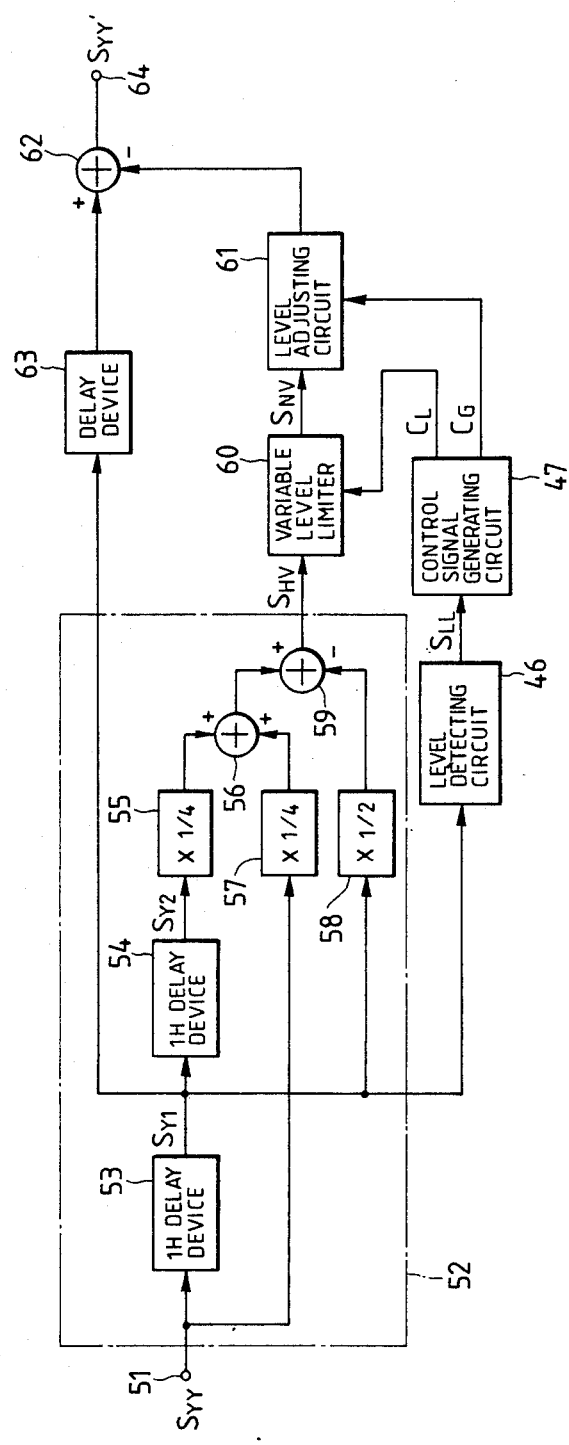
FIG. 7 is a schematic block diagram showing another embodiment of a noise reduction circuit constructed in accordance with the present invention.

FIG. 7 shows another embodiment of a noise reduction circuit constructed in accordance with the present invention which is also specially adapted to the suppression of noise contained in a luminance signal forming a part of a composite video signal. Circuit blocks and signals in FIG. 7 that correspond to those of FIG. 4 are marked with the same references, and further detailed description thereof will be omitted.

In FIG. 7, a luminance signal $S_{YY}$ is supplied via an input terminal 51 to a vertical high pass filter 52. In the vertical high pass filter 52, the luminance signal $S_{YY}$ from the input terminal 51 is delayed by a 1H delay device 53 providing a delay of one line period (1H) to produce a delayed luminance signal $S_{Y1}$ and then delayed further by a 1H delay device 54 providing also a delay of one line period to produce a delayed luminance signal $S_{Y2}$. The delayed luminance signal $S_{Y2}$, which has a delay of two line periods (2H), is multiplied by a factor of one quarter by an attenuator 55 and is thus attenuated in level. Similarly, the luminance signal $S_{YY}$ from the input terminal 51 is attenuated in level by a factor of one quarter by an attenuator 57, and the output of the attenuator 57 is added to the output of the attenuator 55 in an adder 56. The delayed luminance signal $S_{Y1}$ obtained from the 1H delay device 53 is attenuated in level by a factor of one half by an attenuator 58, and the output of the attenuator 58 is added with reversed polarity to the output of the adder 56 in a subtracter 59 to produce a signal component $S_{HV}$ containing line-correlation noise which is derived on the basis of vertical correlation of the video signal.

The signal component $S_{HV}$ thus extracted from the luminance signal $S_{YY}$ by the vertical high pass filter 52 is supplied to a variable level limiter 60 which corresponds to the variable level limiter 35 shown in FIGS. 4 and 5, and a noise suppressing signal $S_{NV}$ is derived from the variable level limiter 60. The noise suppressing signal $S_{NV}$ obtained from the variable level limiter 60 is supplied to a level adjusting circuit 61 which corresponds to the level adjusting circuit 44 shown in FIG. 4. The signal $S_{NV}$ is adjusted in level by the level adjusting circuit 61 and then supplied to a subtracter 62.

In the subtracter 62, the level-adjusted noise suppressing signal $S_{NV}$ is added with reversed polarity to the delayed luminance signal $S_{Y1}$ obtained from the 1H delay device 53. The delayed luminance signal $S_{Y1}$ is further delayed by a delay device 63 so as to coincide in time with the level adjusted noise suppressing signal $S_{NV}$ and then supplied to the subtracter 62. Thus the line-correlation noise canceled by the noise suppressing signal $S_{NY}$. As a result, a luminance signal $S_{YY}'$ in which line-correlation noise is suppressed is obtained from the subtracter 62 and supplied to an output terminal 64.

In this embodiment, the delayed luminance signal $S_{Y1}$ is supplied also to a level detecting circuit 46, and a detection output signal $S_{LL}$ representing an average level of the luminance signal $S_{YY}$ supplied to the input terminal 51 is derived by the level detecting circuit 46 and supplied to a control signal generating circuit 47. From the control signal generating circuit 47, a limit level control signal $C_L$ and a gain control signal $C_G$ formed on the basis of the detection output signal $S_{LL}$ are supplied to the variable level limiter 60 and the level adjusting circuit 61, respectively, so that each of the limit levels applied to the variable level limiter 60 and the gain of the level adjusting circuit 61 are varied in response to the detection output signal $S_{LL}$. As a result, advantages which are the same as those of the embodiment shown in FIG. 4 are also obtained in the embodiment shown in FIG. 7.

Thus there is provided in accordance with the invention a novel and highly-effective noise reduction circuit for suppressing noise contained in a signal having a relatively broad frequency band, such as the luminance signal portion of a composite video signal. The invention avoids the problems and disadvantages of the prior art as described above. In particular, it enables noise suppression without noticeably losing a part of the input signal when the level of the noise contained in the input signal is relatively small, and the noise contained in the input signal is suppressed sufficiently to produce a low-noise output signal when the level of the noise contained in the input signal is relatively large. The noise reduction circuit is specially adapted to reduce noise contained in a luminance signal forming part of a video signal.

Many modifications of the embodiments of the invention disclosed above will readily occur to those skilled in the art. For example, the details of the filter means and other circuit components employed in the invention can be varied, as those skilled in the art will readily understand. Accordingly, the scope of the invention should be determined only by the appended claims.

We claim:

1. A noise reduction circuit for reducing noise contained in an input signal, the circuit comprising:
   input means for receiving an input signal that includes a signal component containing noise;
   filter means connected to the input means for receiving the input signal and extracting the signal component containing noise from the input signal;
   variable level limiting means connected to the filter means for limiting a level of the signal component extracted by the filter means to produce a noise suppressing signal;
   level adjusting means connected to the level limiting means for adjusting a level of the noise suppressing signal;
   level detecting means connected to the input means for receiving the input signal and producing a detection signal indicating a level of the input signal;
   control signal generating means connected to said level detecting means for generating first and second control signals in response to said detection signal, supplying said first control signal to said level limiting means so as to control a limit level of said level limiting means, and supplying said second control signal to said level adjusting means so as to control a gain of said level adjusting means;
   signal subtracting means connected to the input means and the level adjusting means and responsive to the input signal and the noise suppressing signal from said level adjusting means so that the noise suppressing signal is added with reversed polarity to the input signal so as to suppress the noise contained in the input signal; and
   output means connected to said signal subtracting means for supplying an output signal derived from the signal subtracting means.

2. A noise reduction circuit according to claim 1, wherein said control signal generating means adjusts said first control signal so as to decrease an absolute value of said limit level in response to an increase in the level of the input signal and to increase the absolute value of said limit level in response to a decrease in the level of the input signal.

3. A noise reduction circuit according to claim 1, wherein said level limiting means comprises a pair of diodes coupled in parallel with each other with respective opposite polarities in relation to an output of said filter means and biasing means operative to supply said diodes with bias voltages respectively controlled by the first control signal.

4. A noise reduction circuit according to claim 3, wherein said biasing means comprises a first variable voltage source for supplying one of said diodes with a negative bias voltage and a second variable voltage source for supplying the other of said diodes with a positive bias voltage, each of said negative and positive bias voltages being varied in response to the first control signal.

5. A noise reduction circuit according to claim 1, wherein said control signal generating means adjusts said second control signal so as to decrease the gain of said level adjusting means in response to an increase in the level of the input signal and to increase the gain of said level adjusting means in response to a decrease in the level of the input signal.

6. A noise reduction circuit according to claim 1, wherein said filter means comprises a high pass filter for extracting a high frequency component from the input signal.

7. A noise reduction circuit according to claim 1, where said input signal comprises a luminance signal forming a part of a composite video signal.

8. A noise reduction circuit according to claim 7, wherein said level detecting means detects an average level of the luminance signal.

9. A noise reduction circuit according to claim 7, wherein said filter means comprises a first 1H delay device supplied with the luminance signal, a second 1H delay devices connected in series with said first 1H delay device, a first adder supplied with said luminance signal and an output of said second 1H delay device, and a second adder supplied with an output of said first 1H delay device and an output of said first adder produce said signal component.

10. A noise reduction circuit according to claim 1, wherein:
   said input signal comprises a luminance signal forming a part of a composite video signal generated by a video camera having automatic gain control means and means for generating an automatic gain control error signal; and
   said control signal generating means is jointly responsive to said level detecting means and said automatic gain control error signal for generating said first and second control signals.

* * * * *

UNITED STATES PATENT AND TRADEMARK OFFICE
CERTIFICATE OF CORRECTION

PATENT NO. : 4,926,261
DATED : May 15, 1990
INVENTOR(S) : Hiroaki Matsumoto, et al.

It is certified that error appears in the above-identified patent and that said Letters Patent is hereby corrected as shown below:

Col. 5, line 32, delete "s"

same line, after "to" insert -- or higher than $-v_i$, and an output level having a constant positive or negative value is obtained when the input level is -- lined 61, change "voltage variable "to -- variable voltage --

Col. 9, line 1, after "noise" insert -- contained in the delayed luminance signal $S_{y1}$ is --

Signed and Sealed this

Eighth Day of October, 1991

*Attest:*

HARRY F. MANBECK, JR.

*Attesting Officer*      *Commissioner of Patents and Trademarks*